United States Patent [19]

Oh

[11] Patent Number: 5,038,324
[45] Date of Patent: Aug. 6, 1991

[54] SEPARATION CIRCUIT FOR A DRAM

[75] Inventor: Jong H. Oh, Kyungki Do, Rep. of Korea

[73] Assignee: Hyundai Electronics Industries Co., Ltd., Rep. of Korea

[21] Appl. No.: 616,225

[22] Filed: Nov. 20, 1990

[30] Foreign Application Priority Data

Nov. 30, 1989 [KR] Rep. of Korea .................... 89-17545

[51] Int. Cl.⁵ .................... G11C 7/00; G11C 11/40
[52] U.S. Cl. .................... 365/189.01; 365/203; 365/189.05; 365/190
[58] Field of Search .................... 365/189.01, 189.05, 365/190, 207, 208, 203; 330/157

[56] References Cited

U.S. PATENT DOCUMENTS

| | | | |
|---|---|---|---|
| 4,827,454 | 5/1989 | Okazaki | 365/189.05 X |
| 4,845,681 | 7/1989 | Vu et al. | 365/189.05 X |
| 4,926,379 | 5/1990 | Yoshida | 365/189.01 |

Primary Examiner—Alyssa H. Bowler
Attorney, Agent, or Firm—Merchant, Gould, Smith, Edell, Welter & Schmidt

[57] ABSTRACT

A separation circuit for a DRAM where the separation circuit comprises a first separation circuit and a second separation circuit is disclosed. The first separation circuit and the second separation circuit includes a high resistive MOSFET Q7, MOSFET Q9 and a low resistive MOSFET Q8, MOSFET Q10, respectively. The circuit enables the rapid transfer of data during the reading and writing of data to and from a selected memory cell without signal loss which results in an increased sensing ability of a sense amplifier.

5 Claims, 2 Drawing Sheets

FIG. 1
"PRIOR ART"
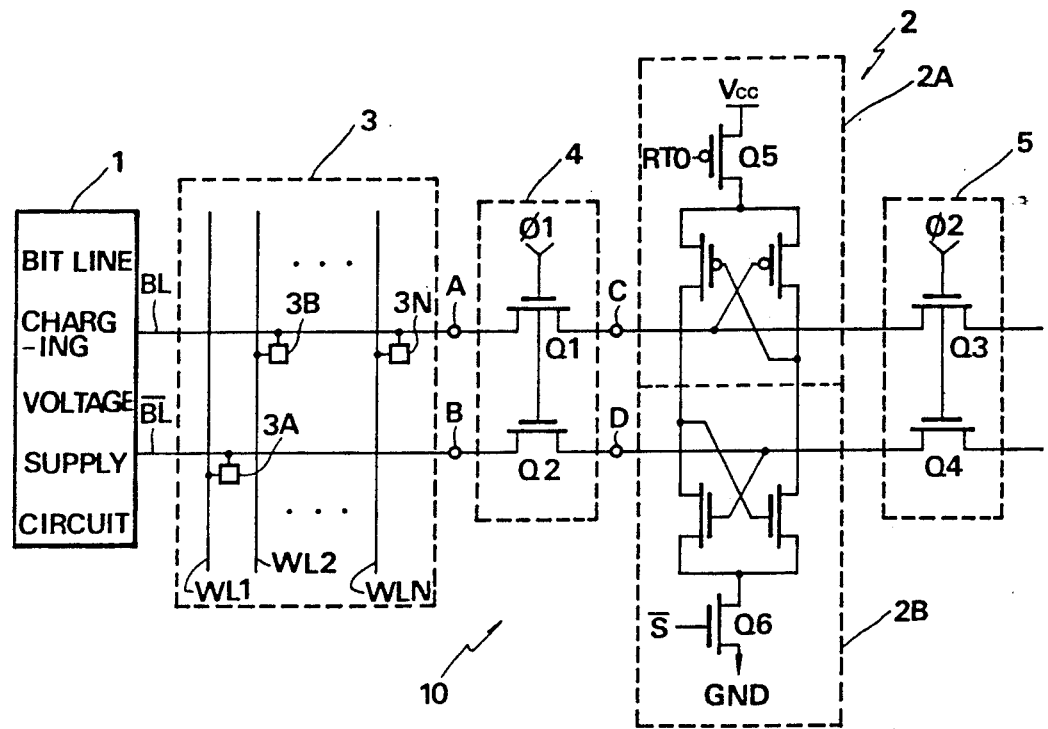
"PRIOR ART"  FIG. 2
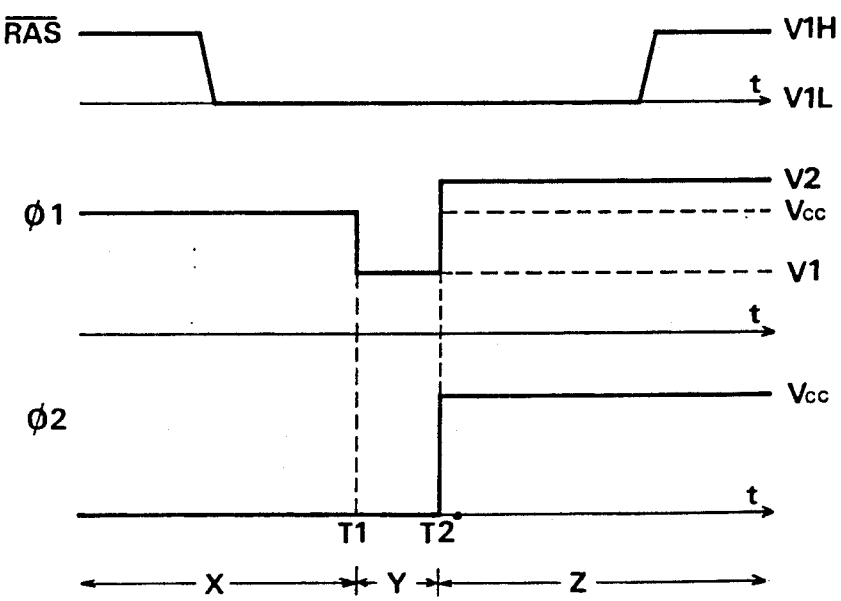

SEPARATION CIRCUIT FOR A DRAM

BACKGROUND OF INVENTION

1. Field of the Invention

The invention relates to a separation circuit for a DRAM, more particularly, to a separation circuit for a DRAM for isolating from the sense amplifier a parasitic capacitance which existed in a pair of bit lines positioned between a sense amplifier and a bit line charging voltage supply circuit when data is stored at a memory cell in the DRAM.

2. Information Disclosure Statement

Generally, in prior art separation circuit for a DRAM, MOSFETs are provided between the sense amplifier and the bit line charging voltage supply circuit, so that the MOSFETs turn "off" when data in the predetermined memory cell is read, and the MOSFETs turn "on" when data is written to the predetermined memory cell. In case that the data in the memory cell is read, the MOSFETs having a relatively high on-resistance value turn "off", so that there is no problem. However, where the data is written to the memory cell, there is a problem since the on-resistance value of the MOSFETs is not approximately equal to zero. In other words, when the data is written to the memory cell, the problem occurs in that the transfer characteristics of the data transferred to the memory cell is deteriorated, since the on-resistance value of the MOSFETs actually reaches up to the several Kilo Ohms (K$\Omega$).

Therefore, it is an object of the present invention to solve the problems set forth above and to provide an improved separation circuit for a DRAM, having high transfer characteristic of the data transferred to the memory cell, when the data is written to the memory cell.

It is a further object of the present invention to provide a separation circuit which when reading and writing data to and from a memory cell, the transfer of such data to the memory cell can be accomplished very rapidly and without signal loss, to thereby increase the sensing ability of the sense amplifier.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The separation circuit for a DRAM of the present invention is defined by the claims with a specific embodiment shown in the attached drawings. For the purpose of summarizing the invention, the invention relates to a separation circuit for a DRAM which comprises a memory cell array apparatus which includes a plurality of memory cells arranged in at least a pair of bit lines BL and $\overline{BL}$ and in a plurality of word lines. A bit line charging voltage supply circuit is used for supplying a bit line charging voltage to the bit lines BL and $\overline{BL}$. A separation circuit is used for selectively operating, in use, when either data is written to a predetermined memory cell selected from the plurality of memory cells, or when data stored at a predetermined memory cell is read therefrom. The separation circuit according to the invention further comprises a first separation circuit and a second separation circuit. The first separation circuit including a high resistive MOSFET Q7 having a pair of electrodes and a gate electrode. One electrode of MOSFET Q7 is connected to the memory cell array apparatus and the gate electrode is connected to receive a supply voltage Vcc. The first separation circuit further includes a low resistive MOSFET Q8 having a pair of electrodes and a gate electrode, with the pair of electrodes connected in parallel to the MOSFET Q7 and the gate electrode connected to receive a control signal $\phi C$. The second separation circuit includes a high resistive MOSFET Q9 having a pair of electrodes and a gate electrode. One electrode of the MOSFET Q9 is connected to the memory cell array apparatus, and the gate electrode is connected to receive a supply voltage Vcc. The second separation circuit further includes a low resistive MOSFET Q10 having a pair of electrodes and a gate electrode, with the pair of electrodes connected in parallel to the MOSFET Q9, and the gate electrode connected to receive a control signal $\phi C$. A sense amplifier having a P-channel sense amplifying unit 2A and an N-channel sense amplifying unit 2B is utilized for detecting and amplifying data transmitted by bit lines BL and $\overline{BL}$, respectively, with the remaining electrode of the first separation circuit connected to the P-channel amplifying unit of the sense amplifier and the remaining electrode of the second separation circuit connected to the N-channel amplifying unit of the sense amplifier, in order to receive data transmitted by the bit line BL and the bit line $\overline{BL}$, respectively. A sense input and output circuit is employed for receiving, in use, a control signal $\phi 2$ and for outputting the data of the bit lines BL and $\overline{BL}$ transmitted from the sense amplifier.

The separation circuit according to the present invention provides, in use, that when reading the data from a selected memory cell, the control signal $\phi C$ is supplied with a potential level equal to the supply voltage Vcc to the gate electrodes of the MOSFETs Q6 and Q10 during an initial operation period of each of the first and second separation circuits, and the control signal $\phi C$ is supplied with a ground level GND thereto during an initial sense operation period of the sense amplifiers, and when writing data to a predetermined memory cell, the control signal $\phi C$ is supplied with a predetermined potential level which is greater than that of the supply voltage Vcc to each gate electrode of the MOSFETs Q8 and Q10 during a sense operation period of the sense amplifier whereby, in use, when reading and writing of data to and from a memory cell occurs, the transfer of such data can be very rapidly accomplished without signal loss thereby increasing the sensing ability of the sense amplifier.

Preferably, the MOSFETs Q7, Q8, Q9 and Q10 are N-channel MOSFETs.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

FIG. 1 a separation circuit for a DRAM according to ,

FIG. 2 illustrates signal wave forms for explaining the separation circuit for a DRAM of FIG. 1.

Similar reference characters refer to similar parts throughout the several views of the drawings.

DETAILED DESCRIPTION OF THE INVENTION

Figure 3:
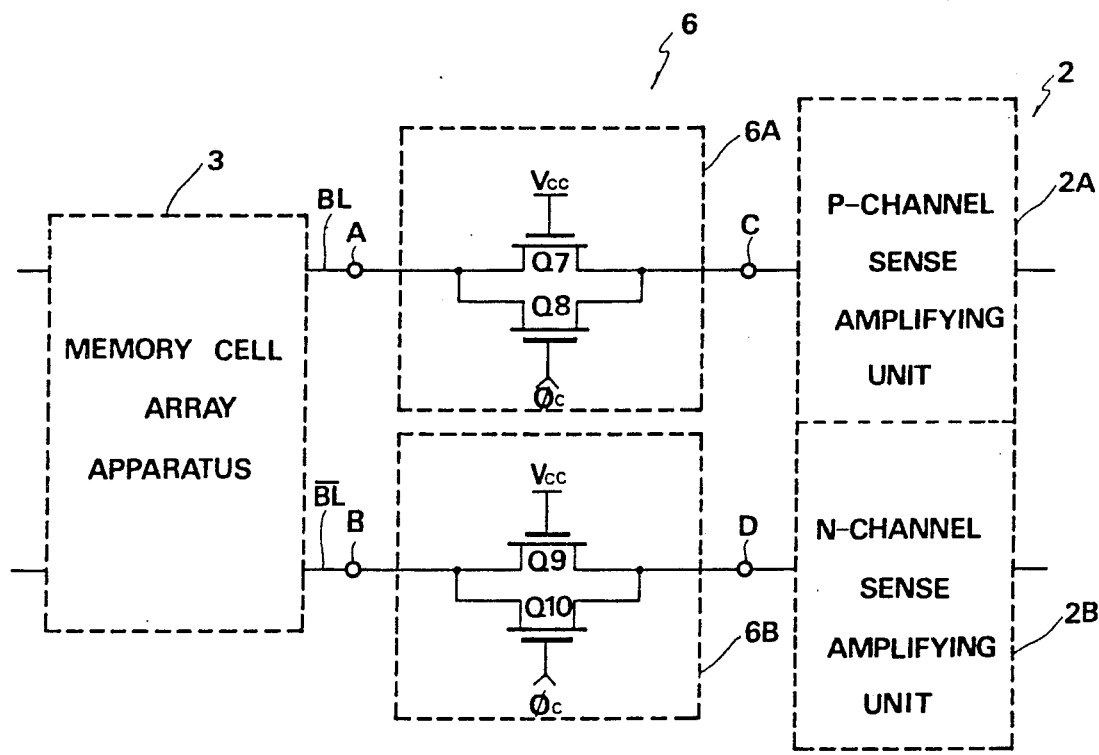
FIG. 3 illustrates a separation circuit for a DRAM according to the invention.

FIG. 1 illustrates a separation circuit for a DRAM according to the prior art. The structure thereof is described in conjunction with FIG. 2. A pair of bit lines BL and $\overline{BL}$ from a bit line charging voltage supply circuit 1 for supplying a bit line charging voltage to the bit lines BL and $\overline{BL}$ are connected, through a memory cell array apparatus 3, to a sense amplifier 2. A separation circuit 4 comprising a pair of MOSFETs Q1 and Q2 is connected between the memory cell array apparatus 3 and the sense amplifier 2. A plurality of memory cells 3A, 3B ... 3N are arranged in the bit lines BL and $\overline{BL}$ and in the word lines WL1, WL2 ... WLN in the memory cell array apparatus 3. The gate electrodes of the MOSFETs Q1 and Q2 in the separation circuit 4 are connected to each other to thereby receive a control signal $\phi1$ for separation, as shown in FIG. 2.

The sense amplifier 2 is provided with a P-channel sense amplifying unit 2A comprising a plurality of P-channel MOSFETs, and a N-channel sense amplifying unit 2B comprising a plurality of N-channel MOSFETs. In order to detect and amplify the signal transmitted through the bit lines BL and $\overline{BL}$, the bit line BL is connected to the P-channel sense amplifying unit 2A, and the bit line BL is connected to the N-channel sense amplifying unit 2B, respectively. The P-channel sense amplifying unit 2A operates depending upon a control signal RTO applied to the gate electrode of the MOSFET Q5, and the N-channel sense amplifying unit 2B operates depending upon a control signal $\overline{S}$ applied to the gate electrode of the MOSFET Q6, respectively. It should be noted that since the P- and N- channel sense amplifying unit 2A and 2B of the sense amplifier 2 are well known in the art, a detailed description of the structure and the operation thereof is not set forth herein. The signal outputted from the P-channel sense amplifying unit 2A and from the N-channel sense amplifying unit 2B of the sense amplifier 2 is, respectively, supplied to the MOSFETs Q3 and Q4 which constitute a sense input and output circuit 5, in which the gate electrodes of the MOSFETs Q3 and Q4 are connected to each other to receive a control signal $\phi2$, as illustrated in FIG. 2, so that the MOSFETs Q3 and Q4 turn "on" depending upon the control signal $\phi2$. The MOSFETs Q1, Q2, Q3, Q4 and Q6 are preferably N-channel MOSFETs.

Referring again to FIG. 2, at time, t<T1, which is the time interval ("X") of the initial operation of the separation circuit 4, if a $\overline{RAS}$ (Row Address Strobe) control signal, which is applied to the word lines WL1, WL2 ... WLN to thereby enable the operation of the DRAM 10 to initialize, enters a "low" level state, shifting from the potential level V1H to the potential level V1L, the DRAM 10 becomes active and a word line of the plurality of the word lines WL1, WL2 ... WLN is selected depending upon the $\overline{RAS}$ control signal.

Accordingly, in this embodiment, if the word line WLN is selected, data (1 or 0) stored at the memory cell 3N in the memory cell array apparatus 3 is transferred, via the MOSFET Q1 of the separation circuit 4 and through a junction C on the bit line BL, to the P-channel sense amplifying unit 2A. At this time, junctions B and D on the bit line $\overline{BL}$ maintain the bit line charging potential level (generally, Vcc/2). Therefore, the sense amplifier 2 senses and amplifies the difference of the potential level derived between the junctions C and D on the bit lines BL and $\overline{BL}$.

Where time t<T1, if the supply voltage Vcc, for example 7 Volt, is supplied to the gate electrodes of the MOSFETs Q1 and Q2 of the separation circuit 4, the MOSFETs Q1 and Q2 turn "on", so that the data stored at the selected memory cell 3N in the memory cell array apparatus 3 is transmitted to the sense amplifier 2.

At time, T1<t<T2, which is the time interval ("Y") of the initial sense operation of the sense amplifier 2, if the control signal $\phi1$ for separation is decreased from the potential level of the supply voltage Vcc to the potential level of the supply voltage V1, as shown in FIG. 2, the supply voltage V1, for example, 4 volt, which is less than 7 volt of the supply voltage Vcc, is supplied to the gate electrodes of the MOSFETs Q1 and Q2 of the separation circuit 4, so that the value of the on-resistance value of the MOSFETs Q1 and Q2 become higher. Thus the higher parasitic capacitance existing in a pair of the bit lines BL and $\overline{BL}$ is then isolated from the sense amplifier.

At time, t>T2, which is the time interval ("Z") of the sense operation of the sense amplifier 2, if the control signal $\phi1$ for separation is increased from the potential level of the supply voltage V1 to the potential level of the supply voltage V2 which is higher than the potential level of the supply voltage Vcc, and the control signal $\phi2$ becomes the potential level of the supply voltage Vcc, the MOSFETs Q3 and Q4 turn "on", since the higher level of the control signal $\phi2$ is supplied to the gate electrodes of the MOSFETs Q3 and Q4. Therefore, the signal of the bit lines BL and $\overline{BL}$ amplified at the sense amplifier 2 is outputted, respectively.

Whereas, in order to completely transfer the data "1" to the memory cell without any signal loss, if an approach is made to write a predetermined data "1" to the predetermined memory cell in the memory cell array apparatus 3, the control signal $\phi1$ for separation applied to the gate electrodes of the MOSFETs Q1 and Q2 in the time period, T1<t<T2, should be greater than the supply voltage Vcc as much as the threshold voltage, Vth, of the MOSFETs Q1 and Q2.

However, when writing the data, the MOSFETs Q1 and Q2 of the separation circuit 4 have a relatively high value of the on-resistance, so that there exists a lot of signal loss. In order to describe above in detail, it will be evaluated by utilizing a mathematical equation where the impedance, i.e., the on-resistance value, of the MOSFET Q1 (or Q2) is controlled according to the change of the potential level thereof, as follow.

It is assumed that the supply voltage V1 of the control signal φ1 for separation is, for example, 4 Volt, and the supply voltage V2 thereof is 7 Volt. The on-resistance value of the MOSFET Q1, Ron, follows:

$$Ron = \left|\frac{\partial Ids}{\partial Vds}\right|^{-1} = \qquad (1)$$

$$\left(\frac{\partial}{\partial Vds}\beta[(Vgs - Vth)Vds - 1/2Vds^2]\right)^{-1}$$

$$= \frac{1}{(Vgs - Vth - Vds)}$$

Wherein "Ids" is a current between the drain electrode and source electrode of the MOSFET Q1, "Vds" is a voltage between the drain electrode and source electrode thereof, "Vgs" is a voltage between the gate electrode and source electrode thereof, "Vth" is a threshold voltage thereof, β is μCo W/L (μ=the movability of the majority carrier thereof), "Co" is a capacitance of the gate electrode per unit area thereof, "L" is a channel length thereof and "W" is a channel width thereof, respectively, If the source voltage "Vs" of the MOSFET Q1 is 0 volt, the drain voltage "Vd" thereof is 1 Volt, and the threshold voltage "Vth" thereof is 1 volt 1) when the gate voltage "Vg1" is 4 Volt, the on-resistance value "Ron" of the MOSFET Q1 can be evaluated from the equation (1) as follow:

$$Ron = \frac{1}{\beta(4 - 1 - 1)} = \frac{1}{2\beta} \qquad (2)$$

2) when the gate voltage "Vg1" is 7 Volt, the on-resistance value "Ron" of the MOSFET Q1 can be evaluated from the equation (2) as follows:

$$Ron = \frac{1}{\beta(7 - 1 - 1)} = \frac{1}{5\beta} \qquad (2')$$

Accordingly, since the impedance adjusting efficiency, f(Ron) is given as follows:

$$f(Ron) = \frac{Ron|Vg2}{Ron|Vg1} \qquad (3)$$

the impedance adjusting efficiency, f(Ron) can consequently evaluated from the equations (2), (2') and (3), as follows:

$$f(Ron) = \frac{1/5\beta}{1/2\beta} = \frac{2}{5} = 0.4 \qquad (4)$$

(Here, it is assumed that the value β is the same in both case of "Vg1"=4 Volt and "Vg2"=7 Volt)

Thus, assuming that the on-resistance value "Ron" is 10 Kilo Ohms, when the gate voltage "Vg" of the MOSFET Q1 is 4 Volt (T1<t<T2), the on-resistance value "Ron", approximately, reaches to 4 Kilo Ohms, when the gate voltage "Vg" of the MOSFET Q1 is 7 Volt (t>T2).

As described above, if the MOSFETs Q1 and Q2 of the separation circuit 4 satisfy the required characteristics in all the time intervals described above, the impedance adjusting efficiency, f(Ron), must have a relatively small value (for example, below 0.1). However, according to the prior art separation circuit 4, it can not be satisfied with the required characteristics in both the time interval T1<t<T2 and the time interval t>T2.

FIG. 3 illustrates a separation circuit for a DRAM according to the present invention. A separation circuit 6 is positioned between the memory cell array apparatus 3 and the sense amplifier 2, in which a first separation circuit 6A is positioned between the junction A and C on the bit line BL, that is, between the memory cell array apparatus 3 and the P-channel sense amplifying unit 2A of the sense amplifier 2. A second separation circuit 6B is positioned between the junction B and D on the bit line $\overline{BL}$, that is, between the memory cell array apparatus 3 and N-channel sense amplifying unit 2B of the sense amplifier 2, respectively.

The first separation circuit 6A comprises a high resistive MOSFET Q7 which turns "on" depending upon the supply voltage Vcc supplied to the gate electrode thereof, and a low resistive MOSFET Q8 connected in parallel to the MOSFETs Q7. The gate electrode of the MOSFET Q8 receives a control signal φC, as shown in FIG. 3.

The second separation circuit 6B comprises a high resistive MOSFET Q9 which also turns "on" depending upon the supply voltage Vcc supplied to the gate electrode thereof, with a low resistive MOSFET Q10 connected, in parallel, to the MOSFET Q9. The gate electrode of the MOSFET Q9 also receives a control signal φC, as shown in FIG. 3. Preferably, the MOSFETs Q7, Q8, Q9, and Q10 are N-channel MOSFETs. Since the structure and the operation of the first and second separation circuit 6A and 6B are the same, a description of the operation of the first separation circuit 6A fully describes the operation of the second separation circuit 6B.

Figure 4:
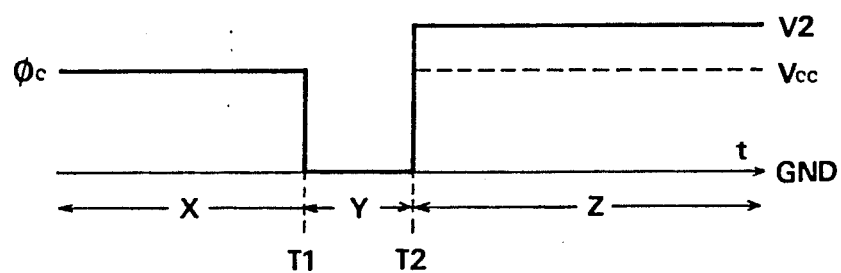
FIG. 4 illustrates signal wave forms for explaining the separation circuit for a DRAM of FIG. 3.

The operation of the separation circuit according to the invention is described with reference to FIG. 4. Referring to FIG. 4, in time, t<T1, which is the time interval of the initial operation of the separation circuit 6, the control signal φC is supplied with a potential level having the potential level of the supply voltage Vcc to the gate electrode of the MOSFET Q7, so that the MOSFET Q7 turn "on". Accordingly, the sense operation of the data stored at the predetermined memory cell in the memory cell array apparatus 3 is performed. Thereafter, in time, T1<t<T2, which is the time interval of the initial operation of the sense amplifier 2, the control signal φC is shifted from the potential level of the supply voltage Vcc to the ground potential level GND, so that the MOSFET Q8 turns completely "off". Thus, the data of the memory cell selected from the memory array apparatus 3 is transmitted, through the MOSFET Q7, to the sense amplifier 2. It is noted that the MOSFET Q7 has a relatively high on-resistance value since the W/L ratio of the MOSFET Q7 is significantly low, whereas the MOSFET Q8 has a relatively low on-resistance value.

When writing the data to the predetermined memory cell, in time, t>T2, which is the time interval of the sense operation of the sense amplifier 2, in order to maximize the transfer characteristics of the data, if the control signal φC applied to the gate electrode of the MOSFET Q8 equals the potential level V2, the MOSFET Q8 turns "on", so that the data is desirably written to the predetermined memory cell without any signal loss, since the on-resistance value of the MOSFET Q8 is relatively low.

This can be expressed by means of the equation as follows:

$$f(Ron) = \frac{Ron|Q8}{Ron|Q7 + Ron|Q8} \quad (5)$$

Thus, if Ron|Q7 is 10 Kilo Ohms, Ron|Q8 is 1 Kilo Ohm and the potential level V2 is determined, f(Ron) can be evaluated less than 0.09. Accordingly, by comparing the resulting value of f(Ron) being 0.09 according to the invention with the resulting value of f(Ron) being 0.04 according to the prior art, clearly illustrates the improved transfer characteristic according to the invention.

Furthermore, it should be noted that since all the control signals illustrated in connection with FIGS. 2 and 4, that is, the control signal $\phi 1$, $\phi 2$ and $\phi C$, and the low address strobe signal $\overline{RAS}$ are, respectively, provided with the prior art control signal sources, with each having a different time sequence relative to each other as shown in the drawings, the detailed description of the structure of the prior art control signal sources are not present herein as such signal sources are well known in the art.

As mentioned above, according to the present invention, when reading and writing data to and from the memory cell, the transfer of the data to the memory cell can be accomplished very rapidly without signal loss, such that the sensing ability of the sense amplifier is increased.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A separation circuit for a DRAM in which the DRAM comprises:
    a bit line charging voltage supply circuit for supplying a bit line charging voltage to at least a pair of bit lines BL and $\overline{BL}$, a memory cell array apparatus including a plurality of memory cells arranged in the bit lines BL and $\overline{BL}$ and in a plurality of word lines WL1, WL2, ... WLN, a separation circuit for selectively operating, either when data is written to a predetermined memory cell selected from the plurality of the memory cells, or when data stored in said predetermined memory cell is read therefrom, a sense amplifier having a P-channel sense amplifying unit connected from said bit line BL and a N-channel sense amplifying unit connected from said bit line $\overline{BL}$, for respectively detecting and amplifying the data corresponding to a selected memory cell, and a sense input and output circuit for respectively outputting the data of said bit lines BL and $\overline{BL}$ transmitted from said sense amplifier, wherein the improvement of said separation circuit operatively connected to said memory cell array apparatus and to said sense input and output circuit comprises:
    a first separation circuit operatively connected to said bit line BL and including a high resistive MOSFET Q7 having a gate electrode connected to receive a supply voltage Vcc, and a pair of electrodes with one electrode connected to said memory cell array apparatus and the remaining electrode connected to said P-channel amplifying unit of said sense amplifier, and further including a low resistive MOSFET Q8 connected, in parallel, to said MOSFET Q7, with said MOSFET Q8 having a gate electrode connected to receive a control signal $\phi C$; and,
    a second separation circuit operatively connected to said bit line $\overline{BL}$ and including a high resistive MOSFET Q9 having a gate electrode connected to receive a supply voltage Vcc, and a pair of electrodes with one electrode connected to said memory cell array apparatus and the remaining electrode connected to said N-channel amplifying unit of said sense amplifier, and further including a low resistive MOSFET Q10 connected, in parallel, to said MOSFET Q9, with said MOSFET Q10 having a gate electrode connected to receive a control signal $\phi C$.

2. The separation circuit for a DRAM of claim 1, wherein said MOSFETs Q7, Q8, Q9 and Q10 are N-channel MOSFETs.

3. The separation circuit for a DRAM of claim 1, wherein, when reading data from a selected memory cell, said control signal $\phi C$ is supplied with the potential level equal to said supply voltage Vcc to each said gate electrode of the MOSFETs Q8 and Q10 during an initial operation period of each said first and second separation circuit, and is supplied with the ground potential level GND thereto during an initial sense operation period of each said sense amplifying unit, and, when writing data to a predetermined memory cell, said control signal $\phi C$ is supplied with the predetermined potential level, which is greater than that of said supply voltage Vcc, to each said gate electrode of said MOSFETs Q8 and Q10 during an sense operation period of each said sense amplifying unit.

4. A separation circuit for a DRAM in which the DRAM comprises:
    a bit line charging voltage supply circuit for supplying a bit line charging voltage to at least a pair of bit lines BL and $\overline{BL}$, a memory cell array apparatus including a plurality of memory cells arranged in the bit lines BL and $\overline{BL}$ and in a plurality of word lines WL1, WL2, ... WLN, a separation circuit for selectively operating, either when data is written to a predetermined memory cell selected from the plurality of the memory cells, or when data stored in said predetermined memory cell is read therefrom, a sense amplifier having a P-channel sense amplifying unit connected from said bit line BL and a N-channel sense amplifying unit connected from said bit line $\overline{BL}$, for respectively detecting and amplifying the data corresponding to a selected memory cell, and a sense input and output circuit for respectively outputting the data of said bit lines BL and $\overline{BL}$ transmitted from said sense amplifier, wherein the improvement of said separation circuit operatively connected to said memory cell array apparatus and to said sense input and output circuit comprises:
    a first separation circuit operatively connected to said bit line BL and including a high resistive MOSFET Q7 having a gate electrode connected to receive a supply voltage Vcc, and a pair of electrodes with one electrode connected to said memory cell array apparatus and the remaining electrode connected to said P-channel amplifying unit of said sense amplifier, and further including a low resistive MOSFET Q8 connected, in parallel, to said MOSFET Q7, with said MOSFET Q8 having a gate electrode connected to receive a control signal $\phi C$; and, a second separation circuit operatively connected to said bit line BL and including a high resistive MOSFET Q9 having a gate electrode connected to receive a supply voltage Vcc, and a pair of electrodes with one electrode connected to said memory cell array apparatus and the remaining electrode connected to said N-channel amplifying unit of said sense amplifier, and further including a low resistive MOSFET Q10 connected, in parallel, to said MOSFET Q9, with said MOSFET Q10 having a gate electrode connected to receive a control signal $\phi C$, such that, in use, when reading data from a selected memory cell, said control signal $\phi C$ is supplied with the potential level equal to said supply voltage Vcc to each said gate electrode of the MOSFETs Q8 and Q10 during an initial operation period of each said first and second separation circuit, and is supplied with the ground potential level GND thereto during an initial sense operation period of each said sense amplifying unit, and, when writing data to a predetermined memory cell, said control signal $\phi C$ is supplied with the predetermined potential level, which is greater than that of said supply voltage Vcc, to each said gate electrode of said MOSFETs Q8 and Q10 during an sense operation period of each said sense amplifying unit.

5. The separation circuit for a DRAM of claim 4, wherein said MOSFETs Q7, Q8, Q9 and Q10 are N-channel MOSFETs.

* * * * *

UNITED STATES PATENT AND TRADEMARK OFFICE
CERTIFICATE OF CORRECTION

PATENT NO. : 5,038,324

DATED : August 6, 1991

INVENTOR(S) : Oh

It is certified that error appears in the above-identified patent and that said Letters Patent is hereby corrected as shown below:

Column 3, line 14; insert --illustrates-- after the word "FIG.1".

Column 3, line 15; delete "," after the word "to".

Column 3, line 15; insert --the prior art.-- after the word "to".

Column 3, line 50; "BL" should read --$\overline{BL}$--.

Column 5, line 10; delete "(1)" after "=".

Column 5, line 17; insert --.....(1)-- after the formula " = $\frac{1}{\qquad}$ ".

Column 5, line 36; "(2)" should read --.....(2)--.

Column 5, line 43; "(2')" should read --....(2')--.

Column 5, line 49; "(3)" should read --   (3)--.

Column 5, line 53; insert --be-- after the word "consequently".

UNITED STATES PATENT AND TRADEMARK OFFICE
CERTIFICATE OF CORRECTION

PATENT NO. : 5,038,324

DATED : August 6, 1991

INVENTOR(S) : Oh

Page 2 of 2

It is certified that error appears in the above-identified patent and that said Letters Patent is hereby corrected as shown below:

Column 5, line 57; "(4)" should read --....(4)--.

Column 7, line 7; "(5)" should read --.....(5)--.

Column 8, line 11, claim 1; "BL" should read --$\overline{BL}$--.

Signed and Sealed this

Twenty-second Day of June, 1993

Attest:

MICHAEL K. KIRK

*Attesting Officer*  *Acting Commissioner of Patents and Trademarks*